United States Patent [19]
DeLoach, Jr. et al.

[11] Patent Number: 4,755,016
[45] Date of Patent: Jul. 5, 1988

[54] COHERENT LIGHTWAVE TRANSMITTERS

[75] Inventors: Bernard C. DeLoach, Jr., New Providence, N.J.; Richard G. Smith, Center Valley, Pa.

[73] Assignee: American Telephone and Telegraph Company AT&T Bell Laboratories, Murray Hill, N.J.

[21] Appl. No.: 795,484

[22] Filed: Nov. 6, 1985

[51] Int. Cl.$^4$ .................. G02B 6/28; H01S 3/098; G02F 1/00
[52] U.S. Cl. ................. 350/96.16; 350/96.10; 350/96.15; 372/18; 372/26; 372/703; 455/602; 455/609; 455/610; 455/612; 455/617; 455/618
[58] Field of Search ............... 350/96.10, 96.13, 96.14, 350/96.15, 96.16, 96.29, 96.30; 372/18, 26, 27, 28, 29, 43, 44, 703; 455/600, 601, 602, 609, 610, 612, 617, 618

[56] References Cited
U.S. PATENT DOCUMENTS

| | | | |
|---|---|---|---|
| 3,312,905 | 4/1967 | Lewis | 372/68 |
| 3,691,483 | 9/1972 | Klein | 372/18 X |
| 3,704,427 | 11/1972 | Heywang | 372/44 X |
| 3,809,887 | 5/1974 | Javan et al. | 455/602 X |
| 4,209,689 | 6/1980 | Linford et al. | 455/609 |
| 4,578,791 | 3/1986 | Chen | 350/96.16 X |
| 4,635,246 | 1/1987 | Taylor et al. | 455/617 X |
| 4,661,786 | 4/1987 | Bender | 372/18 X |
| 4,685,111 | 8/1987 | Baer | 372/18 |

OTHER PUBLICATIONS

Kobayashi et al., "Optical FM Signal Amplification...", IEEE J. of Quant. Elect., vol. QE-18, No. 4, 4/82, pp. 575-581.

Chow, "Phase Locking of Lasers by an Injected Signal", Optics Lett., vol. 7, No. 9, 9/82, pp. 417-419.
"Waveguide Electrooptic Modulators", IEEE Transactions on Microwave Theory and Techniques, vol. MTT-30, No. 8, Aug. 1982, pp. 1121-1137, R. C. Alferness.
"Frequency-stable Packaged 20-kHz Linewidth 1.5 $\mu$m InGaAsP External Cavity Laser Used in an Experimental Heterodyne Optical Fiber System", Conference on Lasers and Electro-optics, Baltimore, Md., May 21-24, 1985, pp. 32-34, K. H. Cameron et al.
"0.8 $\mu$m Band Optical Isolator for Fiber-optic Communication", Topical Meeting on Optical Fiber Communication, Abstract WD2 (1979), Washington, D.C., pp. 56-58, M. Seki et al.
"Stabilized 1.3 $\mu$m Laser Diode-Isolator Module for a Hybrid Optical Integrated Circuit", Topical Meeting on Integrated and Guided Wave Optics, Paper No. MD3-1, Jan. 1980, Nevada, K. Kobayashi et al.
"Injection Locking of Argon-ion Lasers", Optics Letters, vol. 9, No. 8, Aug. 1984, pp. 333-334, C. N. Man et al.

Primary Examiner—William L. Sikes
Assistant Examiner—Brian M. Healy
Attorney, Agent, or Firm—Michael J. Urbano

[57] ABSTRACT

A coherent lightwave transmitter includes a relatively low power, single frequency laser which provides an injection locking signal to a plurality of higher power lasers located in separate, parallel optical paths. A modulator is interposed between the single frequency laser and the higher power lasers, and the outputs of the latter are added constructively to form a high power transmitter output. Feedback control of the optical path lengths to maintain constructive interference is also described.

8 Claims, 2 Drawing Sheets

COHERENT LIGHTWAVE TRANSMITTERS

BACKGROUND OF THE INVENTION

This invention relates to lightwave systems and more particularly, to coherent lightwave systems.

In a conventional lightwave system the output of a laser or LED is amplitude modulated, for example, digitally, so that information to be tramsitted is contained in the intensitey nvelope of the lightwave signal. The frequency of the lightwaves, on the other hand, contains no such information, and in a conventional fiberoptic system, is related only to such transmission characteristics as attenuation and dispersion. In contrast, in a coherent lightwave system the phase or instantaneous frequency of the lightwaves must be well-defined and controlled in order to transmit information. For example, in a phase-shifted-keyed (PSK) coherent system the phase of the lightwaves carries the information, and in a frequency modulated (FM) system the instantaneous frequency of the carrier contains the information. In an amplitude modulated (AM) coherent system using heterodyne detection the precise frequency of the lightwaves, which serve as a carrier, is important because in the receiver the carrier signal is mixed with a local master oscillator signal to generate a lower frequency beat signal from which the information is extracted.

It is apparent, therefore, that the frequency of the light source is crucial to the successful operation of a coherent system and the realization of its primary advantage, extreme sensitivity (i.e., the ability to detect low intensity signals). For a given optical power the latter implies transmission over longer distances with fewer repeaters than a conventional lightwave system. It follows, therefore, that it would be desirable to maximize the optical power transmitted for a given amount of electrical bias power supplied to the transmitter of a coherent system. The transmitted power, in principle, could be increased by simply using a more powerful laser, but in doing so other system parameters must be carefully considered; for example, the power threshold for damage to the modulator use to impress information onto the lightwave output of the laser, and the loss experienced by the laser output in passing through the modulator.

SUMMARY OF THE INVENTION

In accordance with one embodiment of our invention, a coherent lightwave transmitter includes a relatively narrow line width laser master oscillator (e.g., a single frequency laser) for generating a relatively low power injection locking signal having a well-defined phase. The output of the master oscillator is coupled to a modulator (e.g., a phase modulator). A plurality of optical paths is coupled to the output of the modulator, and a plurality of stimulated emission devices for generating relatively high power lightwave signals (e.g., high power lasers or optical amplifiers) is provided, with the devices being located in separate ones of the optical paths so that the injection signal locks the phase of the lightwave output of the devices to that of the master oscillator. The phase-locked lightwave signals on the optical paths are combined (constructive interference) to form a high power output signal on at least one output optical path.

In a further embodiment of our invention, feedback control is provided to sense the combined output of the stimulated emission devices in order to adjust the optical path length of at least one of the separate paths. The adjustment insures that the signals in each of the paths are maintained in phase with one another and hence add constructively in the output path.

One advantage of our transmitter arrangement is that the modulator is subject only to the relatively low power levels of the master oscillator, thus avoiding damage which might occur if the outputs of a plurality of higher power lasers were first combined and then passed through the modulator. Secondly, even if higher power lasers wre combined at the input of the modulator without exceeding its damage threshold, the insertion loss of the modulator (illustratively, about 3 dB) would be experienced by each laser output. Consequently, for a given set of system specifications each laser would have to provide higher power and would be relatively inefficient because the bias (dc) power would have to be doubled. The latter constraint is particularly disadvantageous if dc power is at a premium and/or if state-of-the-art technology does not allow increasing the output power of each laser adequately to compensate for the insertion loss of the modulator.

BRIEF DESCRIPTION OF THE DRAWING

Our invention, together with its various features and advantages, can be readily understood from the following more detailed description taken in conjunction with the accompanying drawing, in which.

DETAILED DESCRIPTION

Figure 1:
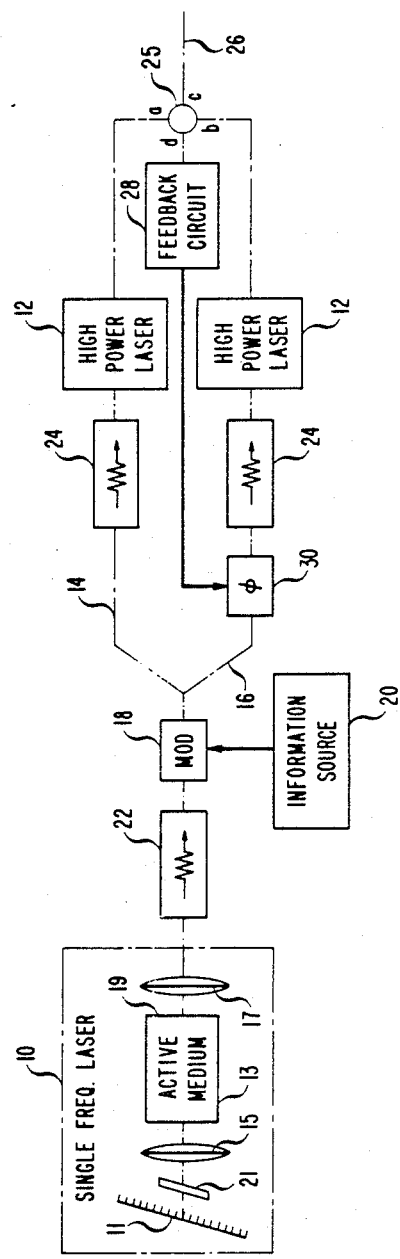
FIG. 1 is a schematic of a coherent lightwave transmitter in accordance with one embodiment of our invention in which a relatively low power, single frequency laser injection locks a pair of higher power lasers.

Turning now to FIG. 1, a coherent lightwave transmitter in accordance with an illustrative embodiment of our invention comprises a relatively low power, narrow line width laser master oscillator (e.g., single frequency laser 10) which is used to provide an injection locking signal to a plurality of higher power lasers 12 located in separate parallel optical paths 14 and 16. Two lasers 12 in two optical paths are shown for simplicity only. A modulator 18, illustratively a phase modulator, is interposed between the single frequency laser 10 and the higher power lasers 12. Thus, the output of the single frequency laser 10 is modulated in accordance with information provided by information source 20 which drives the modulator 18.

Generally, the line width of the single frequency laser 10 is highly sensitive to small optical reflections, and, as a consequence, it is prudent to interpose an optical isolator 22 between the laser 10 and the modulator 18. For similar reasons, isolators 24 may be inserted in the optical paths 14 and 16 between the modulator 18 and the higher power lasers 12.

The outputs of the high power lasers 12 are combined (constructively added) in combining means illustratively depicted as a four-port 3 dB optical hybrid coupler 25. As shown, the laser outputs are optically coupled to opposite ports a and b, the transmitter output on output path 26 is coupled to a third port c, and the fourth port d provides a feedback error signal whenever the inputs to ports a and b are out of phase with one another. This error signal is supplied to feedback circuit 28 which in turn varies the optical path length of at least one of the parallel paths, here illustratively taken to be path 16. This path length control is achieved by means of a phase modulation (e.g., delay) element 30 inserted in path 16 and coupled to the output of feedback circuit 28. Since the output of the hybrid coupler 25 is an optical signal at port d, the feedback circuit, of course, includes a photodetector (not shown) which converts the optical signal to an electrical equivalent.

One mode of operation for the feedback circuit contemplates that the output of port d would be essentially zero and the output of port c would be at a maximum whenever the outputs of lasers 12 are of essentially the same intensity and phase. Whenever they are out of balance, however, the feedback circuit would hunt around a power minimum at port d at a slow rate in order to generate an error signal which would be supplied to the delay element 30. The end result of the feedback control is to maintain the difference in the hybrid coupler 25 at $n\lambda$, where n is an integer and $\lambda$ is the wavelength of the lightwave as measured in the optical paths.

In addition, it should be noted that automatic gain control (AGC) can readily be incorporated in the transmitter, but is not shown, to adjust the bias to lasers 12 in order to accommodate a situation in which the outputs of lasers 12 might differ (e.g., one laser is degrading).

Analysis of the coherent transmitter of FIG. 1 indicates that, if we assume that the optical loss in the isolators, modulator and other components totals 3 dB (a reasonable estimate), then 3 dB less power is required from each of the higher power lasers 12 in order to achieve the same output power on path 26, as compared to using a single high power laser coupled to the input of the modulator 18 with the output of the latter coupled to path 26 directly. In addition, the transmitter of FIG. 1 uses two lasers 12 instead of one and thus the power required per laser is reduced by a factor of 4.

Figure 2:
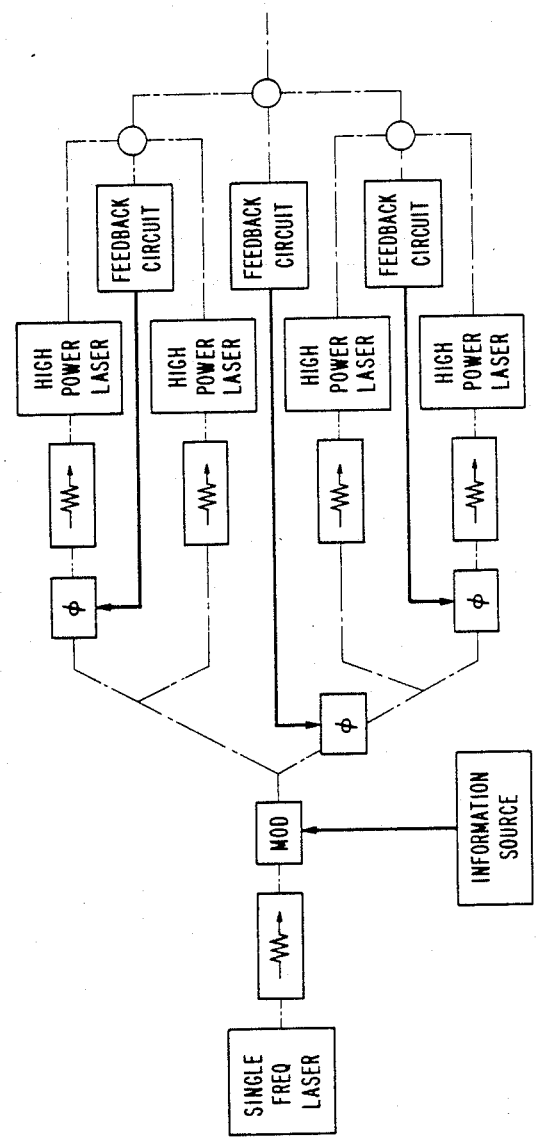
FIG. 2 is a schematic of a coherent lightwave transmitter in accordance with another embodiment of our invention similar to FIG. 1 but in which four higher power lasers are injection locked.

The arrangement of FIG. 1 is "repeatable" so that larger numbers of high power lasers can be incorporated into a plurality of optical paths coupled through suitable optical hybrid couplers to the transmitter output. One such scheme is shown in FIG. 2 for handling four high power lasers in four separate optical paths between the modulator and the transmitter output. As compared to FIG. 1, the transmitter of FIG. 2 further reduces by a factor of 2 the power required per high power laser. Thus, as compared to an arrangement using a single high power laser at the input of the modulator, the power required per laser is reduced by a factor of 8.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. The various components of the transmitters of FIGS. 1 and 2 are well-known in the art. Lasers 12 are illustratively InP/InGaAsP semiconductor lasers operating at, say, 1.3 or 1.55 $\mu$. Well-known channel substrate buried heterostructure (CSBH) or double channel planar buried heterostructure (DCPBH) lasers are suitable. Modulator 18 and element 30 may be lithium niobate phase modulators as described by R. C. Alferness in *IEEE Trans. Microwave Theory and Tech,* Vol. MTT-30, p. 1122 (1982). Isolators 22 and 24 may be of the type described by M. Seki et al, Topical Meeting on Optical Fiber Communications, WD2, Washington, D.C. (1979). Hybrid coupler 25 illustratively comprises a 50% beam splitter well-known in the art. Finally, single frequency laser 10 illustratively comprises a distributed feedback (DFB) InP/InGaAsP 1.55 $\mu$m semiconductor laser of the type described by K. H. Cameron et al in *CLEO 85 Technical Digest,* pp. 32-34. It includes a semiconductor laser active medium 13 disposed in an external cavity formed by a grating 11 and an end facet 19 of the active medium chip. Lenses 15 and 17 are conventional optical elements used to couple the lightwaves between the grating and the chip, on the one hand, and the chip and the isolator 22, on the other hand. a silica tuning plate 21 is used to fine tune the laser output. An external cavity single frequency semiconductor laser 10 of this type can have a stable, narrow line width of approximately 20-200 kHZ and delivers a low level (e.g., 0.1 to 1 mW) locking signal to the higher power (e.g., 10-20 mW) lasers 12. The locking signal in general should have sufficiently high intensity to dominate small reflections and thus easily control the line width of the lasers 12.

It is additionally contemplated within the scope of the invention that the light paths 14 and 16 coupling the various components may be integrated optical dielectric wave guides, and the high power lasers may be either discrete chips or monolithically integrated on a single chip. Likewise, the modulators, isolators and phase delay elements could be integrated.

In applications where a line width as narrow as a few tens of kilohertz is not required, other single frequency lasers can be used, e.g., a standard DFB semiconductor laser (without an external cavity resonator) is capable of generating an output having a line width of about 100 MHz at about 1 mW (the line width is inversely proportional to the power).

The applications of a coherent lightwave transmitter of the type described herein are many, including fiber loop systems, long haul terrestrial systems, and long haul submarine cable systems.

What is claimed is:

1. a coherent lightwave transmitter comprising:
   a relatively narrow line width master oscillator for generating a relatively low power level injecting locking lightwave signal having a well-defined phase,
   means for modulating said signal, said modulating means having an input coupled to said master oscillator and an output,
   a plurality of optical paths coupled to said output of said modulating means,
   a plurality of stimulated emission devices for generating relatively higher power lightwave signals, said devices being located in separate ones of said optical paths so that said injection signal locks the phase of the lightwave output of said devices to that of said master oscillator,
   means for combining said higher power signals of said devices to form an output signal of said transmitter, and
   feedback means responsive to said output signal for controlling the optical path length of a least one of said paths so that the outputs of said devices constructively interfere in said combining means.

2. The transmitter of claim 1 wherein
said combining means comprises a four-port hybrid coupler optical coupler, a first one of said ports being coupled to said output optical path, second and third one of said ports being coupled to separate ones of said devices, and a fourth one of said ports being coupled to said feedback means.

3. The transmitter of claim 2 further including
a path-length adjusting element located in at least one of said separate paths, the output of said feedback means being coupled to said element so as to maintain the difference of the optical lengths of said paths essentially equal to $n\lambda$, where n is an integer and $\lambda$ is the wavelength of the lightwave signals as measured in said path.

4. The transmitter of claim 1 wherein said devices comprise lasers.

5. The transmitter of claim 4 wherein said master oscillator comprises a single frequency semiconductor laser and said devices comprise semiconductor lasers.

6. The transmitter of claim 1 wherein said devices comprise optical amplifiers.

7. The transmitter of claim 1 further including an optical isolator between said master oscillator and said modulating means.

8. The transmitter of claim 7 further including optical isolators positioned between said modulating means and each of said devices.

* * * * *